(12) United States Patent  (10) Patent No.: US 8,287,956 B2
Partridge et al.  (45) Date of Patent: Oct. 16, 2012

(54) CRACK AND RESIDUE FREE CONFORMAL DEPOSITED SILICON OXIDE WITH PREDICTABLE AND UNIFORM ETCHING CHARACTERISTICS

(75) Inventors: Aaron Partridge, Palo Alto, CA (US); Markus Lutz, Palo Alto, CA (US); Silvia Kronmueller, Schwaikheim (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 12/578,739

(22) Filed: Oct. 14, 2009

(65) Prior Publication Data

US 2010/0159627 A1 Jun. 24, 2010

Related U.S. Application Data

(62) Division of application No. 10/713,172, filed on Nov. 14, 2003, now Pat. No. 7,625,603.

(51) Int. Cl.
*C23C 16/00* (2006.01)

(52) U.S. Cl. ......... 427/255.15; 427/248.1; 427/255.18; 427/255.19

(58) Field of Classification Search .............. 427/255.15, 427/248.1
See application file for complete search history.

(56) References Cited

U.S. PATENT DOCUMENTS

| | | | |
|---|---|---|---|
| 4,851,370 A * | 7/1989 | Doklan et al. ............... 438/762 |
| 4,914,500 A * | 4/1990 | Liu et al. ..................... 257/384 |
| 5,020,212 A * | 6/1991 | Michijima et al. ......... 29/603.13 |
| 5,256,247 A | 10/1993 | Watanabe et al. |
| 5,503,285 A | 4/1996 | Warren |
| 5,637,518 A | 6/1997 | Prall et al. |
| 5,683,591 A | 11/1997 | Offenberg |
| 5,710,079 A * | 1/1998 | Sukharev ...................... 438/778 |
| 5,804,083 A | 9/1998 | Ishii et al. |
| 5,869,384 A | 2/1999 | Yu et al. |
| 5,904,570 A | 5/1999 | Chen et al. |
| 5,922,212 A | 7/1999 | Kano et al. |
| 5,990,019 A | 11/1999 | Torek et al. |
| 6,174,820 B1 * | 1/2001 | Habermehl et al. .......... 438/745 |
| 6,232,658 B1 * | 5/2001 | Catabay et al. ............... 257/701 |
| 6,318,175 B1 | 11/2001 | Muchow et al. |
| 6,436,790 B2 | 8/2002 | Ito |
| 6,544,898 B2 | 4/2003 | Polson et al. |
| 6,602,806 B1 | 8/2003 | Xia et al. |
| 6,635,509 B1 * | 10/2003 | Ouellet ........................ 438/106 |
| 6,800,503 B2 * | 10/2004 | Kocis et al. .................... 438/52 |
| 6,936,491 B2 * | 8/2005 | Partridge et al. ............... 438/48 |
| 7,514,283 B2 * | 4/2009 | Partridge et al. ............... 438/48 |
| 7,767,482 B1 * | 8/2010 | Stark et al. ..................... 438/50 |
| 2003/0073293 A1 | 4/2003 | Ferro et al. |
| 2003/0134038 A1 * | 7/2003 | Paranjpe .................... 427/248.1 |
| 2004/0065932 A1 | 4/2004 | Reichenbach et al. |
| 2004/0248376 A1 * | 12/2004 | Kiihamaki .................... 438/456 |
| 2006/0258039 A1 * | 11/2006 | Lutz et al. ...................... 438/50 |
| 2011/0033967 A1 * | 2/2011 | Lutz et al. ...................... 438/51 |

* cited by examiner

*Primary Examiner* — Timothy Meeks
*Assistant Examiner* — Mandy Louie
(74) *Attorney, Agent, or Firm* — Kenyon & Kenyon LLP

(57) ABSTRACT

A silicon oxide layer is formed by oxidation or decomposition of a silicon precursor gas in an oxygen-rich environment followed by annealing. The silicon oxide layer may be formed with slightly compressive stress to yield, following annealing, an oxide layer having very low stress. The silicon oxide layer thus formed is readily etched without resulting residue using HF-vapor.

14 Claims, 11 Drawing Sheets

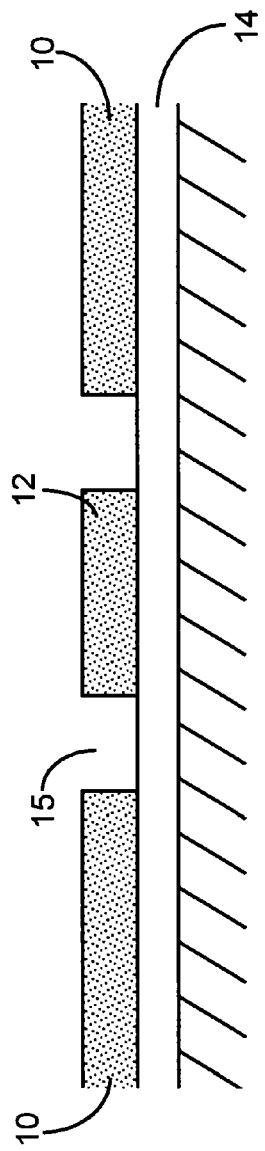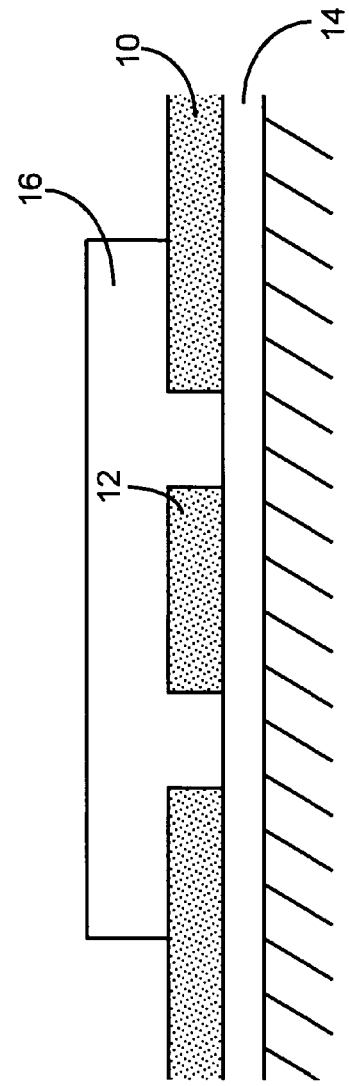

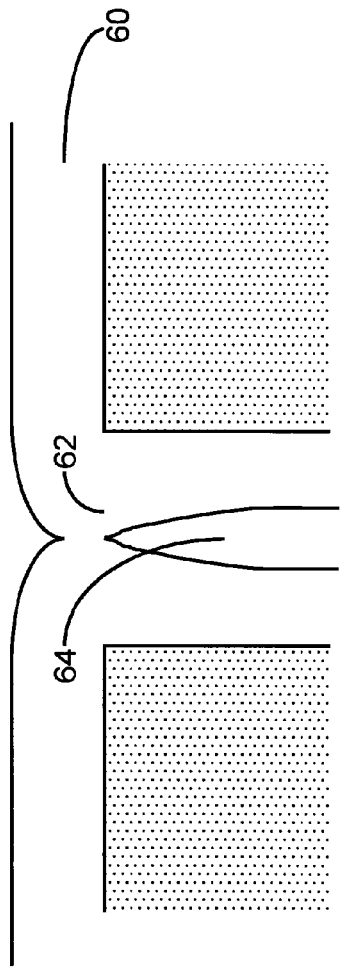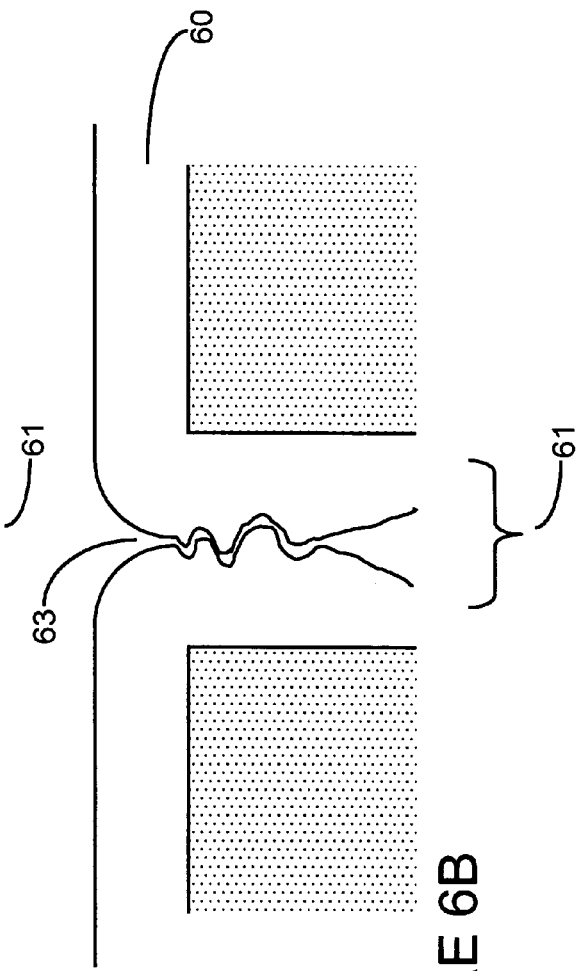
FIGURE 6A
FIGURE 6B

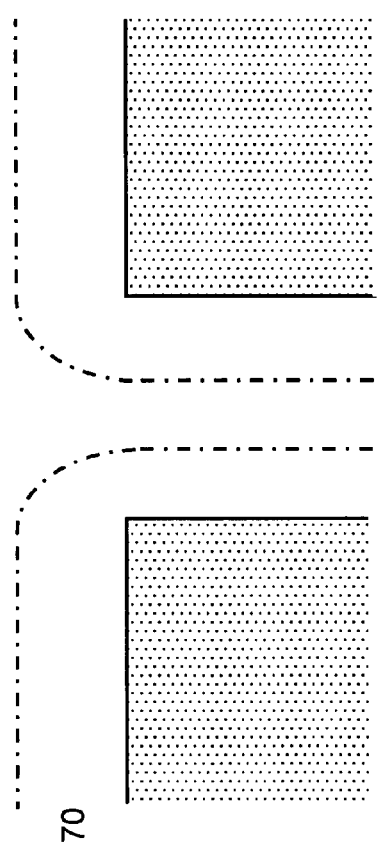
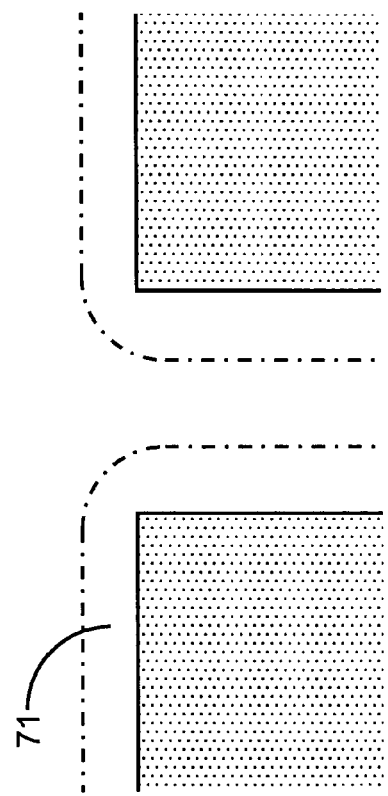

CRACK AND RESIDUE FREE CONFORMAL DEPOSITED SILICON OXIDE WITH PREDICTABLE AND UNIFORM ETCHING CHARACTERISTICS

CROSS-REFERENCE TO RELATED APPLICATION

This application is a divisional of, and incorporates herein by reference in their entirety the contents of, U.S. patent application Ser. No. 10/713,172, which was filed on Nov. 14, 2003 now U.S. Pat. No. 7,625,603.

BACKGROUND

The present invention relates generally to a method of forming and/or etching silicon oxide during the fabrication of a semiconductor structure, an optical device, or an electromechanical system. Silicon oxide layers formed in accordance with the present invention have particular application in the field of microelectromechanical systems (MEMS).

The term "MEMS" is used to describe a broad class of electromechanical systems having one or more micro and/or nano-sized components. MEMS are characterized in their implementation by the use of micro-machining techniques, such as lithographic and other precision fabrication techniques, to reduce mechanical components to a scale generally comparable to microelectronics. MEMS are further characterized in most instances by the operative assembly, arrangement and/or formation of these miniaturized components on a silicon substrate. Contemporary examples of MEMS-implemented devices include sensors, actuators, gyroscopes, resonators and accelerometers.

The delicate mechanical structures used in conventional MEMS are typically sealed in a chamber. The chamber may be formed using a hermetically sealed metal container or by the bonding of a semiconductor or glass-like substrate having a chamber to house, accommodate or cover the mechanical structure. However, it can be difficult to cost effectively integrate MEMS that employ a hermetically sealed metal container or a bonded semiconductor or glass-like substrate to protect the mechanical structures on the same substrate with high performance integrated circuitry. In this regard, the additional processing required to integrate the high performance integrated circuitry tends to either damage or destroy the mechanical structures.

Another technique for forming a chamber to protect the delicate mechanical structures employs micromachining techniques. Using this approach, a mechanical structure is encapsulated in a chamber using a conventional oxide ($SiO_2$) deposited or formed using conventional techniques, such as oxidation using low temperature techniques (LTO), tetraethoxysilane (TEOS), or the like. Thereafter, this combination is enclosed under a silicon layer or other material, and the oxide removed. When implementing this technique, the mechanical structure is encapsulated prior to packaging and/or integration with integrated circuitry.

Such oxides often exhibits high tensile stress, particularly at deposition corners or steps. Further, such oxides are often formed or deposited in a manner that provides poor coverage of the underlying surface(s). These shortcomings may impact the integrity and/or performance of the MEMS.

Moreover, the removal of conventional oxides during the formation of MEMS may produce an etch residue on the mechanical structures during the encapsulation process. This etch residue may impact the integrity of the mechanical structures and, as such, the performance or operating characteristics of the MEMS (for example, the operating characteristics of a resonator).

In practice, MEMS formed in accordance with conventional techniques often suffer from significant process-induced performance variations or outright component failure. To a great extent, inadequacies associated with the formation and/or removal of oxide layers account for many of these failures and undesired performance variations.

First, many conventional oxide layers crack during MEMS fabrication, and/or damage or crack the MEMS structure on which they are deposited. Cracking occurs during deposition of the oxide and/or during high temperature processing steps applied to the MEMS following deposition of an oxide layer. These high temperature processes may range in temperature from 800° C. to 1200° C. Too avoid cracking the internal stress of an oxide layer must be well controlled. Both highly tensile and highly compressive oxide layers are undesirable. Highly tensile oxide layers may deform delicate MEMS components or crack outright. Highly compressive oxide layers may also deform MEMS components or cause tensile cracking in these components or in adjacent materials.

It is well understood that deposited oxides tend to densify or shrink when annealed at high temperature. This tendency creates tensile stress in the deposited oxide. In addition, as fabrication temperature rises, a previously deposited oxide on silicon becomes relatively tensile because the thermal expansion coefficient for the oxide is less than that of the adjacent silicon. Under the combined effect of these tendencies, an oxide layer deposited at moderate temperature may crack or may damage the MEMS structures when subsequently heated to significantly higher temperatures.

In many applications, the etch rate of an oxide used in the formation of a MEMS structure must be well controlled and uniform, from batch to batch, across each batch, and across each substrate. This is particularly true where the formation of a MEMS structure requires that some portion of an oxide be left in place while another portion of the oxide is etched away, and where the extent of the oxide etch determines what portion remains. This condition, often called a 'timed etch," requires that the oxide etch at a predetermined, predictable, uniform, and homogenous rate.

In many applications, it is highly desirable for the oxide to be conformal. Conformal deposition of an oxide over a MEMS structure provides uniform coating and fills structural gaps with a minimum of deposited oxide on the upper-most surface of the substrate. Unfortunately, highly conformal, conventional oxides are often susceptible to cracking and often contain materials that result in residue formation when the oxide is subsequently etched.

In many MEMS applications, an oxide must be readily susceptible to etching without producing a residue. Conventional oxides deposited from compounds like TEOS are rich in carbon and other contaminates. Such contaminates promote the development of etch residues. This is particularly true where deposited oxides are subsequently exposed to high temperature. Conventional oxides also tend to form inclusions when exposed to high temperatures. Etch residues, which tend to be silicon in nature, can accumulate to the point where the etching process becomes uneven across an etch surface or impossible. Etch residues can accumulate to the point where device functionality becomes impaired.

The adverse impact of etch residues is highly notable in the context of MEMS fabrication. To a much greater extent than conventional semiconductor fabrications, MEMS fabrications require deep cavity oxide etching. HF-vapor etching is particularly sensitive to the formation of a residue since no "washing" mechanism exists to remove residue, as contrasted to wet etching processes. Unlike many conventional semiconductor fabrications, a wet etching process often cannot be applied to removal of an accumulated residue during some MEMS fabrications. Accordingly, an oxide free from etch residue is particularly important to MEMS fabrications.

The desired thickness for oxide layers used during the formation of MEMS varies considerably. This variation notwithstanding the deposition thickness for an oxide layer must be well controlled. The deposition of an oxide layer may be performed many times during the formation of MEMS. Accordingly, the time required to deposit an oxide layer is a material economics consideration in the determination of a MEMS fabrication process.

In sum, an ideal oxide would deposit and anneal without cracking. It would have low, well controlled stress. It would contain minimal contaminants or inclusions even after being exposed to high temperatures. It would be conformal. It would etch at a predictable, homogeneous rate. It would etch in HF vapor without leaving a residue, especially after being exposed to high temperatures. Finally, it would deposit sufficiently fast to economically form layers of varying, well-controlled thickness.

Unfortunately, many of these desirable properties are at odds one with another. For example, highly conformal, conventional oxides are prone to cracking and often contain contaminants that promote etch residue.

There remains a need for an oxide having many, if not all, of the desirable qualities noted above. Such an oxide would provide particular advantage in the fabrication of MEMS.

SUMMARY OF THE INVENTION

The present invention is described hereafter and claimed below in multiple aspects. In one aspect, a method according to the present invention provides silicon oxide having many, if not all, of the desired properties noted above. That is, a highly conformal, low stress, non-cracking silicon oxide layer is obtained by a method in which a silicon precursor gas is decomposed or oxidized in a deposition chamber containing a substrate at a first temperature. The silicon precursor gas may be any gas containing silicon. Ready examples of a silicon precursor gas that may be used to good advantage include tetaethoxysilane (TEOS), silane ($SiH_4$), dichlorosilane (DCS), diethylsilane (DES), and/or tetramethylcyclotetrasiloxane (TOMCATS). The deposition may be enhanced with plasma or ozone. Following deposition of the silicon oxide layer, the deposition chamber is heated to a second temperature higher than the first temperature to anneal the silicon oxide layer. Alternatively, the substrates are moved to a second chamber for annealing.

Iterative deposition and annealing of the silicon oxide layer in accordance with this aspect of the present invention results in a highly conformal silicon oxide layer having well-controlled stress and reduced contaminants and inclusions. The marked reduction in contaminants and inclusions allows the silicon oxide to be subsequently etched without formation of significant residue.

In a related aspect, the silicon precursor gas is preferably provided into a deposition chamber having an oxygen rich environment. Similarly, annealing of the silicon oxide layer is preferably performed in an oxidizing atmosphere. It is often preferred that the second (annealing) temperature should be approximate to or as high as the highest processing temperature subsequently applied to the substrate following formation of the silicon oxide layer.

In another aspect, the present invention also provides a method of forming a MEMS structure on a substrate. Where an oxide layer, sacrificial or otherwise, is beneficial to the formation of a MEMS, the method of the present invention may be advantageously applied. This is particularly true for MEMS applications where a sealing chamber for a mechanical or an electromechanical structure is required.

In a related aspect, an oxide layer provided by the method of the present invention may be deposited with well-defined and well-controlled stress. For example, it is often advantageous for an oxide layer to be formed over a MEMS component with slightly compressive stress such that a subsequent annealing step yields an oxide layer only slightly tensile, and thus unlikely to fail.

In all of the foregoing aspects, the present invention may be applied to doped and undoped oxides.

Further, the present invention provides a method of HF vapor etching an oxide layer formed in accordance with the present invention. This method effectively removes the oxide and any resulting etch residue where overly silicon-rich or carbon contaminated conditions exist.

BRIEF DESCRIPTION OF THE DRAWINGS

In the course of the description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 1A through 1C illustrate the formation of a MEMS and highlight in one example the role of an oxide layer within a MEMS fabrication;

FIGS. 6A and 6B illustrate fabrication problems associated with thick depositions of conventional oxides over a trench structure;

FIGS. 7A through 7F illustrate a presently preferred method of depositing an oxide layer over a trench structure in accordance with the present invention; and, FIG. 8 is a flowchart illustrating an exemplary method of HF vapor etching an oxide layer formed in accordance with the present invention.

DETAILED DESCRIPTION

Figure 1C:
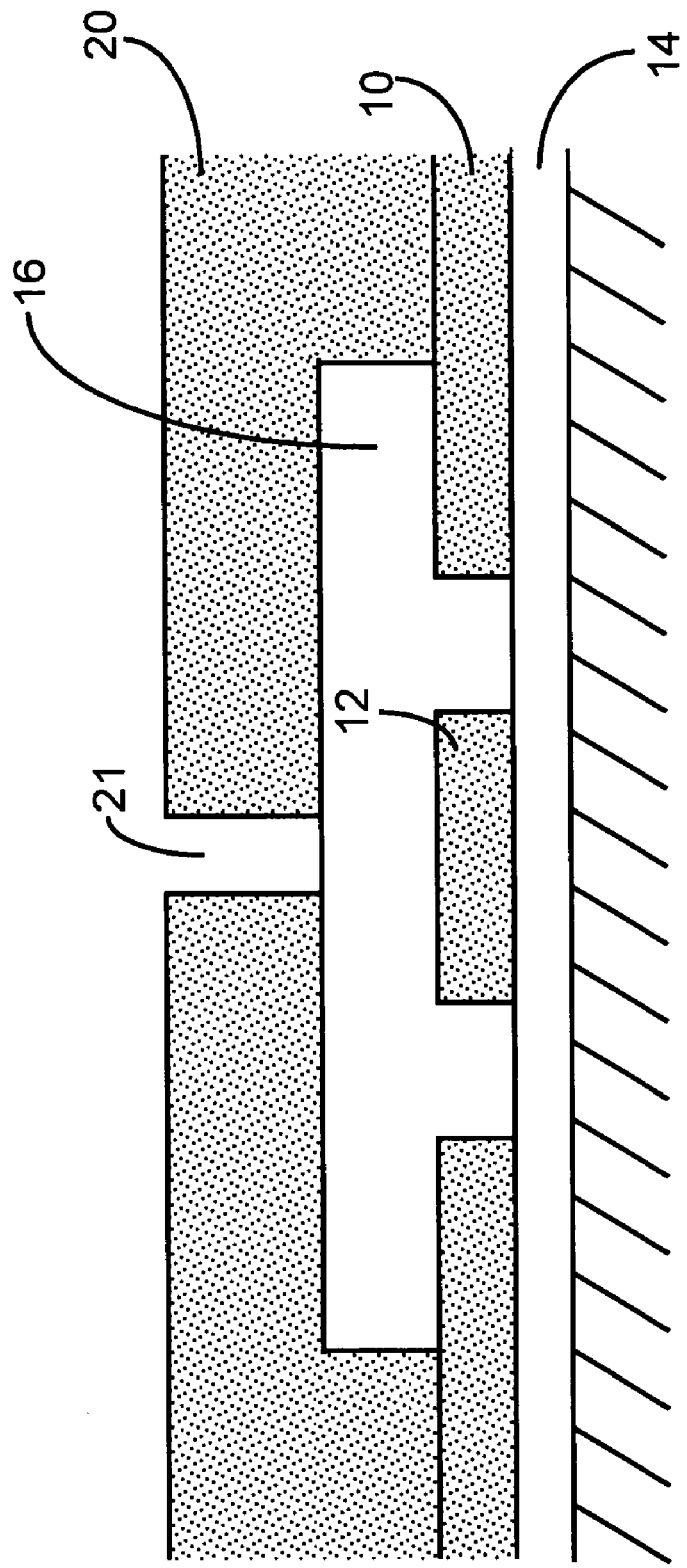

The present invention, in its multiple related aspects, is described below using a number of examples. For clarity, these examples are drawn to some specific teaching embodiments.

In a first aspect, the present invention recognizes a unique combination of benefits afforded by the iterative annealing of an oxide layer under prescribed conditions. The term "layer" is used as a practical description for any spatially and/or temporally specific oxide formation. It should not be read as being limited to only long horizontally disposed structures, although such structures are most commonly formed by conventional deposition techniques. Any area portion, segment, spot, strata, etc., may be considered a "layer" for purposes of this description.

By "iterative", i.e., one or more times following oxide layer formation, annealing an oxide layer according to the dictates of the present invention, the stress of the oxide is well-controlled and contaminates and inclusions within the oxide layer are significantly reduced. It is known that an annealing step can be used to change the stress of an oxide layer. Indeed, the stress of oxide layers used in conventional semiconductor fabrications and high voltage isolation layers have been modified by annealing for some time now. Further, is known that many contaminants may be "burned-out" of an oxide layer by exposing the oxide layer to high temperature. However, the present invention first recognizes that under properly controlled conditions, oxide stress may be managed AND both contaminants and inclusions may be removed from an oxide layer.

An "inclusion" is different from a "contaminant" within the context of this description. A clear example of this difference may be understood by considering an example. We assume the use of a silane TEOS precursor gas for the formation of a silicon oxide layer. Conventional wisdom recognizes that carbon atoms are likely to contaminate the layer of oxidized silicon derived from the TEOS. Such contamination may be uniform across the oxide layer. The carbon atoms can be subsequently removed by heating the silicon oxide layer to a temperature sufficient to burn off the carbon.

Unfortunately, some silicon oxide layers formed from an oxidized, silicon precursor gas also includes free, partially free, or singly bonded silicon atoms. Free silicon atoms are not fully bonded to oxygen to form silicon oxide molecules within the oxide layer. An oxide layer having free silicon atoms in material quantity is referred to as a "non-stochiometric" oxide.

When exposed to high temperature, the free silicon atoms in a non-stochiometric oxide become mobile and seek out chemical bonds. Such bonds are often found, particularly in the absence of sufficient oxygen, with other silicon atoms. Mutually bonded silicon atoms, often along with associated trapped contaminants, may form clusters. Such clusters are termed "inclusions." Inclusions may be unequally distributed throughout the oxide layer. Further, the use of conventional techniques for removing contaminants only reinforces or grows the inclusions, and a "stochiometric" oxide layer having pronounced silicon inclusions results.

When a stochiometric oxide layer is subjected to a subsequent HF-vapor etching process, the silicon oxide is removed, but the silicon inclusions remain behind as a tough, silicon-based residue insusceptible to the vapor etching. The silicon residue formed by vapor etching a stochiometric oxide resembles an amorphous silicon powder. When vapor etched, a 1 to 5 micron thick oxide layer may yield an order of 0.1 micron thick crust of this powdery, snow-like, silicon residue.

Unlike conventional techniques directed to contamination removal, the present invention provides a method of forming an oxide that addresses and mitigates the effects of contaminants and inclusions, while at the same time allowing stress within the oxide layer to remain well-controlled.

The formation of an exemplary MEMS structure is illustrated in FIGS. 1A through 1C. In relevant portion as shown in FIG. 1A, a MEMS structure 12 is formed on a first oxide layer 14 over a substrate 11. MEMS structure 12 can be a single mechanical or electromechanical component or a combination of multiple components. MEMS structure 12 is laterally separated from a surrounding silicon layer 10 by gap 15. In the simple illustrated example, gap 15 surrounds a single MEMS structure 12. However, in actual practice, gap 15 may be a complex cavity or chamber holding one or more MEMS structures which may include more gaps 15 as part of their structure.

Following formation of these elements, a second oxide layer 16 is deposited and patterned to fill gap 15 and cover MEMS structure 12. See, FIG. 1B. Thereafter, as shown in FIG. 1C, an epitaxal polysilicon layer 20 is formed over second oxide layer 16. Materials other than epitaxal polysilicon can be used, such as a nitride or metal (e.g., aluminum) layer. In one advantageous approach, silicon layer 20 is subsequently planarized and vented 21 to allow etching of the sacrificial oxide layers 16 and 14. The MEMS structure 12 is mechanically freed upon removal of the first and second oxide layers. This may be accomplished using any one of a number of conventional etching processes applied to oxide layers 16 and 14 through vents 21. HF-vapor etching is well adapted for this purpose.

Commonly assigned U.S. patent application Ser. Nos. 10/454,867 and 10/455,555, both filed Jun. 4, 2003 further describe a number of embodiments in which one or more oxide layers, including sacrificial oxide layers, are deposited and/or etched in the formation of various encapsulation structures for MEMS components. Both of these applications are hereby incorporated by reference in their entirety. Additionally, U.S. patent application Ser. No. 10/018,180 filed Sep. 9, 2002 and Ser. No. 10/240,339 filed May 9, 2003 are hereby incorporated by reference.

Silicon oxide may be used to good advantage as a sacrificial layer required to form the foregoing example and their like. However, the performance requirements for such an oxide are significant, including one or more of the following characteristics. The oxide must not deform the mechanical structure it is deposited over, or crack the surrounding material layers. Hence, stress in the oxide layer must be well controlled. The oxide layer must be sufficiently conformal to fill gaps and cover MEMS structure(s). Further, the sacrificial oxide layer(s) must etch well without the production of a residue that would preclude complete etching or impair device operation.

Figure 2:
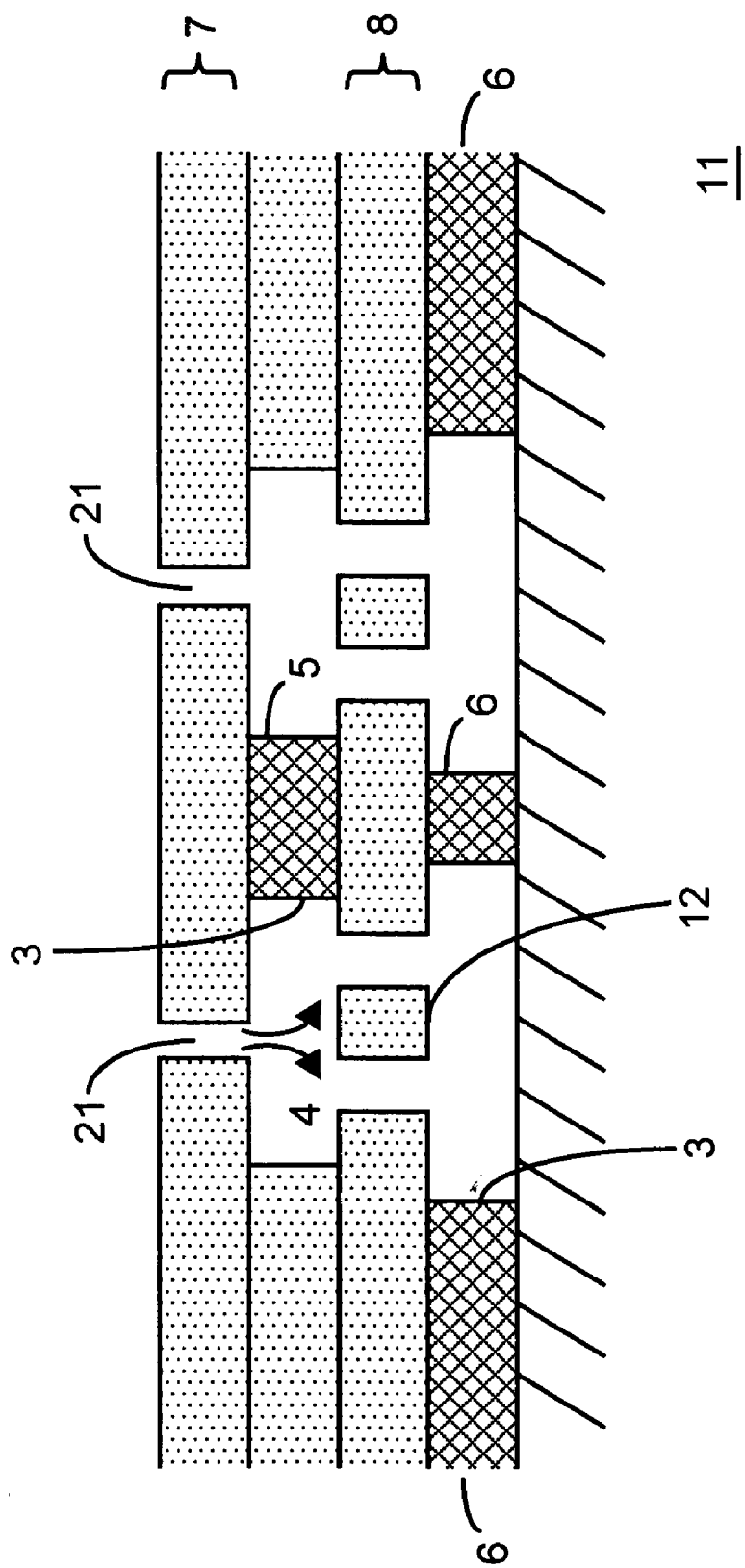
FIG. 2 further illustrates use of an oxide layer formed in accordance with the present invention in the formation of a MEMS structure.

FIG. 2 further illustrates use of an oxide layer formed in accordance with the present invention in the fabrication of a MEMS. Of note, the uniform etch rate provided by the oxide layer allows well-controlled, partial etching (i.e., a timed etch) of complex cavities. In FIG. 2, a buried oxide layer 6 is formed over a substrate 11, e.g., a conventional Silicon-On Insulator (SOI) structure. Thereafter, a MEMS layer 8 is formed, including MEMS structure 12. An oxide layer formed in accordance with the present invention is formed over the MEMS layer 8 and an encapsulation layer 7 is formed over the entire structure.

The oxide layer is subsequently etched through gaps 21 (vent holes) formed in encapsulation layer 7. By careful control of the etch process, all or part of the various portions of the respective oxide layers may be removed. For example, one portion 4 of the oxide layer formed in accordance with the present invention is completely removed to form a complex cavity while another portion 5 remains in the final structure. Similarly, selected portions of the buried oxide layer 6 may be removed during the etch process. (Naturally the buried oxide may also be formed using the present invention). In any event, well-controlled etch fronts 3 are maintained during the etch process. The desired size of the remaining portions of the respective oxide layers are determined by the etch characteristics of the oxide, e.g., the etch rate and etch uniformity.

In one presently preferred embodiment, the method of the present invention provides for a low-pressure chemical vapor deposition (LPCVD) of silicon oxide from a reaction of a silicon precursor gas, namely, tetraethoxysilane (TEOS). Other deposition processes may alternatively be used. Alternative examples of a silicon precursor gas include, for example, silane ($SiH_4$) dichlorosilane (DCS), diethysilane (DES), and tetramethylcyclotetrasiloxane (TOMCATS). Ozone processes are also possible including, for example, ozone-TEOS. Furthermore, plasma processes, such as plasma enhanced chemical vapor deposition (PECVD) may be used to form the oxide layer contemplated by the present invention.

Figure 3:
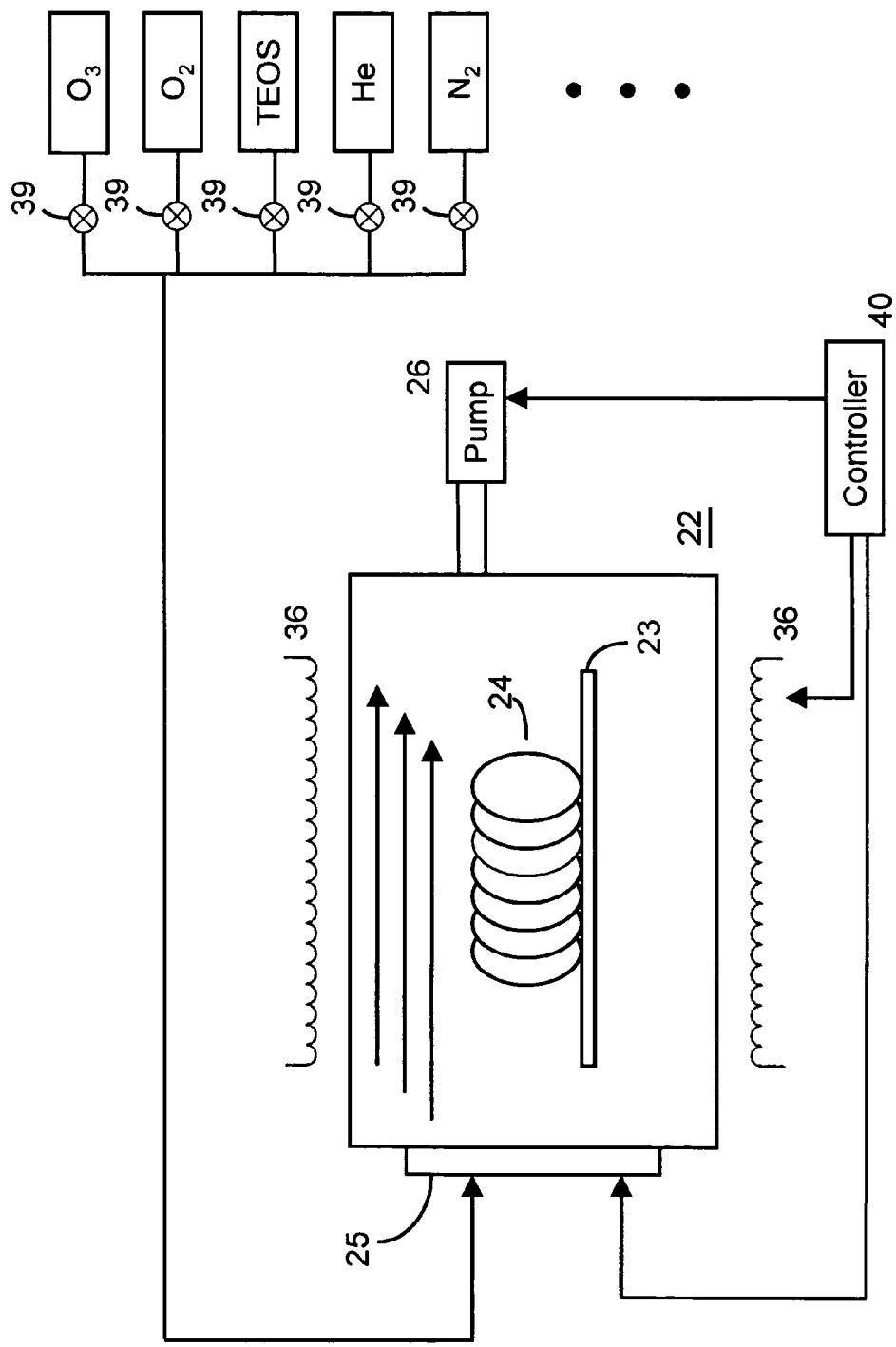
FIG. 3 is a general schematic illustration of a first deposition chamber suitable for use in the making of a silicon oxide layer according to the present invention.

Deposition of a silicon oxide layer formed in accordance with the present invention may be accomplished in an wafer processing system such as the one schematically illustrated in FIG. 3. This figure describes use within the context of the present invention of a conventional hot-walled LPCVD tube 22. A silicon precursor gas, preferably TEOS, is introduced near faceplate 25 and flows over a collection of one or more wafers 24 assembled in a holding rack 23. Controller 40 controls operation of the hot-walled LPCVD tube 22 generally, including heating elements 36, and an assembly of gas flow control valves 39. Following reaction, gases (e.g., reaction products and un-reacted precursors) are exhausted by means of an evacuation pump 26.

Figure 4:
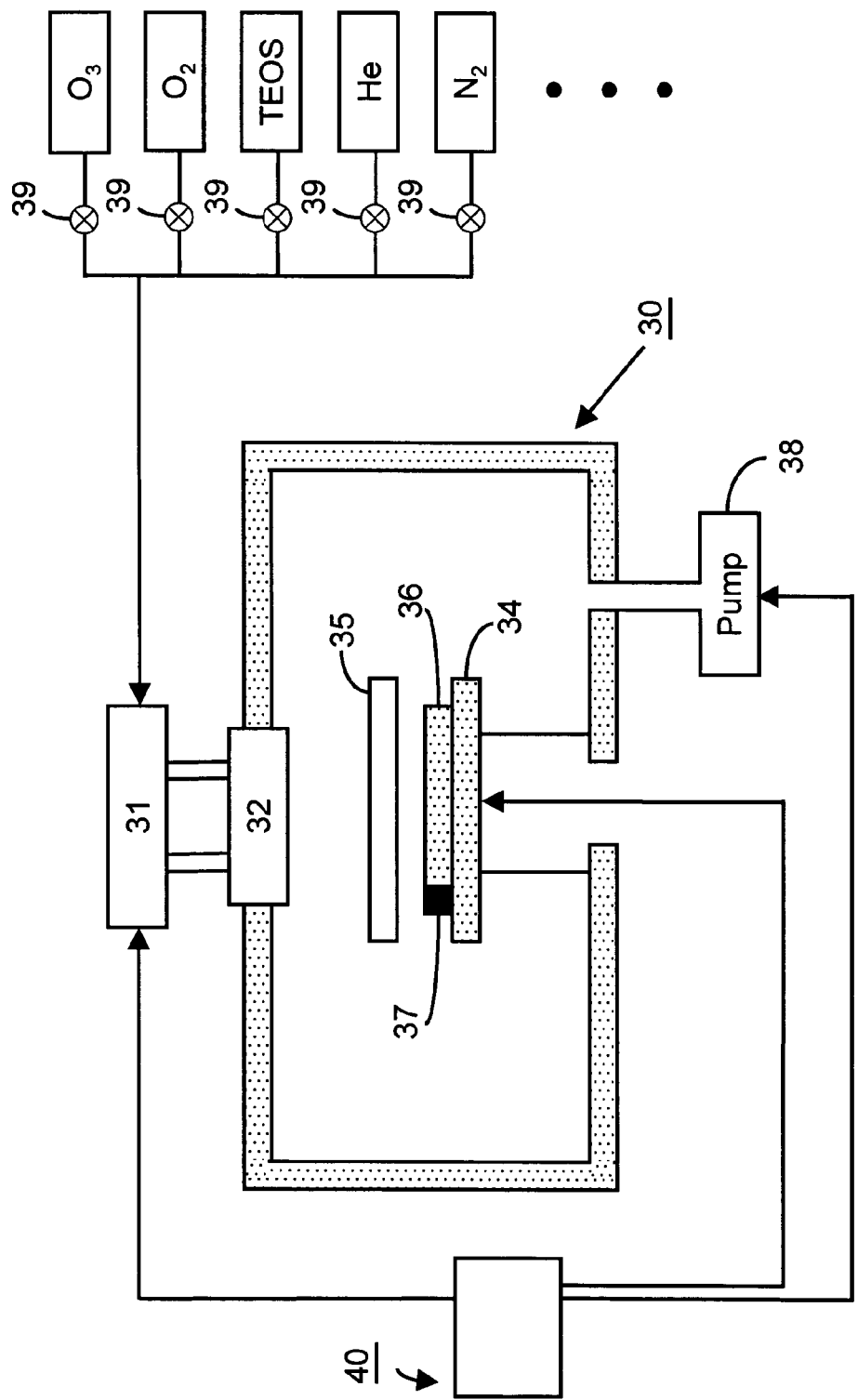
FIG. 4 is a general schematic illustration of a second deposition chamber suitable for use in the making of a silicon oxide layer according to the present invention.

Another conventional wafer processing system well adapted for use within the context of the present invention is schematically illustrated in FIG. 4. The system generally comprises a process chamber 30, a gas panel 31, and a control unit 40, along with other hardware components, such as power supplies and vacuum pumps, and control software.

The process chamber 30 generally houses a support pedestal 34, which is used to support a one or more wafers 35 within the chamber. Depending on the specific process being performed, wafers 35 can be heated to a desired temperature prior to silicon oxide deposition using, for example, an embedded heating element 36. A temperature sensor 37, such as a thermocouple, may also be embedded in support pedestal 34. The measured temperature within the chamber is used in a feedback loop to control a power supply (not shown) driving heating element 36, such that wafers 35 are maintained at a desired temperature.

A vacuum pump 38 is used to evacuate process chamber 30 and to maintain proper gas flows and pressure inside chamber 30. A showerhead 32 through which gases are introduced into chamber 30 is located above support pedestal 34. Showerhead 32 is connected to gas panel 31 that controls the supply of various gases during a process sequence. Proper control and regulation of gas flows through panel 31 are accomplished by mass flow meter(s) 39 and controller 40. Multiple gas cylinders containing, for example, TEOS, oxygen ($O_2$), ozone ($O_3$), helium (He), nitrogen ($N_2$), ozone ($O_3$), etc., are connected to gas panel 31. Showerhead 32 allows process gases from gas panel 32 to be uniformly introduced and distributed in process chamber 30.

Plasma depositions may be accomplished by the provision of electrodes (not shown) within the exemplary deposition chamber shown in FIG. 3. Plasma enhanced CVD is much faster than the LPCVD example discussed in relation to the example above in which TEOS is used as a silicon precursor gas in a LPCVD deposition. Ozone-assisted TEOS also results in much improved deposition rates.

The exact layout and operation of a deposition chamber is a function of the specific silicon precursor gas being used, the desired deposition rate and ultimate thickness of the oxide layer desired, and the number of wafers being processed at one time.

Figure 5:
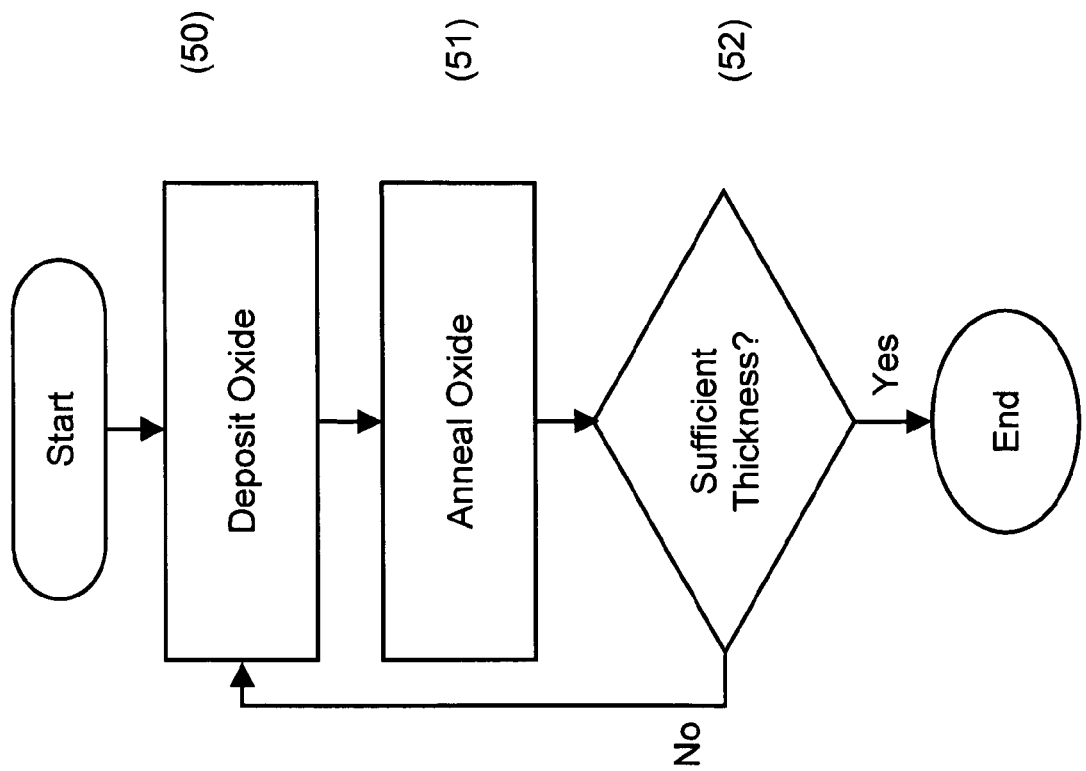
FIG. 5 is a flowchart outlining methods steps in one presently preferred embodiment of the present invention.

The method of forming an oxide layer according to the present invention may be implemented in many conventional wafer processing systems, including as additional examples batch plasma and ozone systems. The method allows deposition of a highly conformal, non-cracking, silicon oxide layer that may be etched without residue. In yet another aspect, the method of the present invention may be characterized by the steps shown in the flowchart of FIG. 5. These steps include:
1. depositing an oxide layer on a substrate at a first temperature (Step 50);
2. annealing the oxide layer at a second temperature higher than the first temperature (Step 51); and,
3. repeating these steps, upon a determination that the required deposition thickness has not been achieved (Step 52=No).

The deposition step may be accomplished using any one or more of a number of conventionally available silicon precursor gases. Low pressure and high pressure deposition processes may successfully be used in the formation of the oxide layer.

In a related aspect of the present invention, oxide deposition is preferably performed in an oxygen-rich environment. With available excess oxygen, the number of free silicon atoms found in the resulting silicon oxide layer is reduced. Any process step or sequence of steps for ensuring that sufficient oxygen atoms are available to materially reduce the number of free carbon and/or silicon atoms in a resulting oxide layer is termed providing "an oxygen-rich environment." However, while an oxygen rich environment is beneficial it is not required.

The annealing step may be successfully performed at atmospheric pressure, as well as high and low pressures. It may be performed in the deposition chamber or in a second chamber, for example, a standard oxidation furnace. As with the deposition step, it is presently preferred that the annealing step take place in an oxygen-rich environment, but this is not required. Indeed, certain adaptations of the present invention benefit from an annealing step performed in a non-oxidizing atmosphere. However, omission of the annealing step yields a silicon oxide layer susceptible to subsequent cracking at high temperatures and prone to leaving etch residues.

The process steps described above may be repeated as necessary to form a silicon oxide layer having a desired thickness. Oxide layers having a thickness ranging from 0.5 to 5.0 µm have been successfully formed, but this is just a presently preferred range. Oxide thickness will vary by specific application. In many applications a single cycle of steps 1 and 2 above will provide a silicon oxide layer of sufficient thickness.

As a further illustration of the method according to the present invention, high quality silicon oxide may be deposited using LPCVD-TEOS at a first temperature of 680° C., a pressure of 1.6 T, with a TEOS flow rate of 30 sccm, and with an oxygen flow rate of 300 sccm. Acceptable silicon oxide layers may be formed at a first temperature ranging from 650 to 750° C., and across a range of pressures from 0.2 to 10 T. TEOS and $O_2$ flow rates in the above example may be varied by a decade up and down with acceptable results.

Typical annealing parameters include a second temperature of 1100° C. applied to the deposited silicon oxide in an oxygen-rich environment. Acceptable silicon oxide layers may be formed across an annealing temperature range of from 700 to 1200° C. Annealing temperatures higher than 1200° C. are possible, but not commonly used in MEMS fabrications. Lower annealing temperatures do not crack the silicon oxide, but thermally stabilize the oxide layer only up to or around the annealing temperature. Subsequent processing steps applied to the substrate having a temperature materially higher than that used to anneal the silicon oxide layer may crack the oxide. Accordingly, it is presently preferred that the silicon oxide layer be annealed at a second temperature approximate to, or higher than the highest temperature applied to the substrate during subsequent processing steps.

As with some conventional oxide layers, high temperature annealing tends to increase the tensile stress of the silicon oxide layer formed by the present invention. Accordingly, in yet another aspect of the present invention, it is preferred to initially deposit a slightly compressive oxide layer, such that the subsequent annealing step results in a silicon oxide layer having very low stress. Further, some silicon oxide layers covering large areas cannot be annealed as a continuous film without cracking. In such cases, the total coverage area may be patterned into smaller coverage areas and annealed. Oxides covering these smaller areas are much less likely to crack during annealing. The size of the coverage area should be determined in relation to the second (annealing) temperature and the desired (or acceptable) thickness of the oxide layer.

The ambient environment used during the silicon oxide annealing step is preferably oxygen-rich, but may alternatively or additionally include nitrogen, argon, ozone or steam. Nitrogen anneals may reduce subsequent cracking in the silicon oxide layer, but are less effective in removing contaminate inclusions that may subsequently produce a residue during etching.

Relatively thick oxide layers are prone to cracking. They are also more likely to crack surrounding layers or deform MEMS components. Thus, determining the desired thickness for a silicon oxide layer formed in accordance with the present invention must take into account many factors, including; the selected annealing temperature, the size, form, and material of the covered MEMS structure, and the shape and extent of the patterning to be performed on the silicon oxide layer. With an un-patterned LPCVD TEOS, as described above, a silicon oxide layer thickness of approximately one micron may readily be achieved. For oxide layers having a desired thickness equal to or less than one micron, a single deposition-and-anneal cycle may suffice.

Where relatively thicker silicon oxide layers are desired the cycle of steps described above may be repeated as desired. A typical sequence for the exemplary LPCVD using TEOS described above includes three cycles to form a silicon oxide layer having a thickness of two microns. In many applications, multiple thin depositions will be preferred to a single deposition of sufficient thickness. This is true even where a thicker deposition layer is practical. That is, multiple thin depositions will aid in oxide layer uniformity and coverage. Complete annealing all the way through the silicon oxide layer is also promoted by the use of multiple thin deposition cycles. The deposition thickness of the silicon oxide layer according to the present invention is well controlled and adapted for single cycle as well as multiple cycle processes.

The use of multiple, relatively thinner oxide layers is further illustrated in FIGS. 6A, 6B, and FIG. 7A through 7F. FIGS. 6A and 6B illustrate the difficulty of properly forming an oxide layer over a trench structure 61 using only a single, relatively think layer 60. While the surface of the underlying structure and the sidewalls of the trench structure are covered by oxide layer 60, a fill gap 64 is also formed between the sidewalls. This gap is sometimes called a "chimney" or a "keyhole." Stress associated with fill gap 64 is concentrated at point 62. Accordingly when oxide layer 60 is annealed, a crack 63 is formed form due to the additional stress caused by shrinkage of oxide layer 60.

Figure 7C:
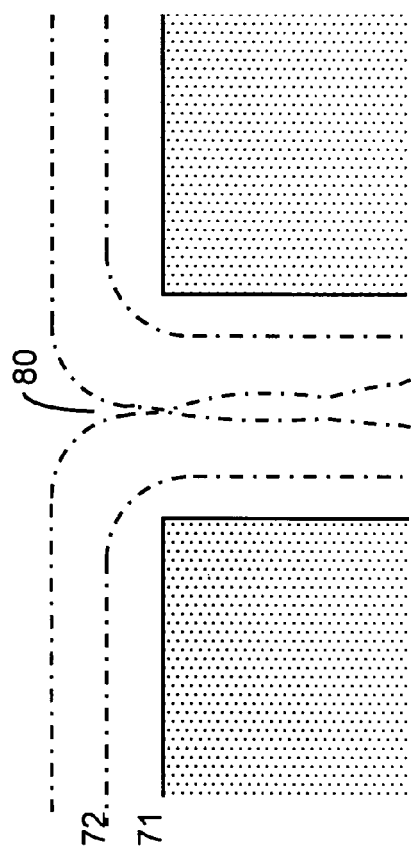
Figure 7D:
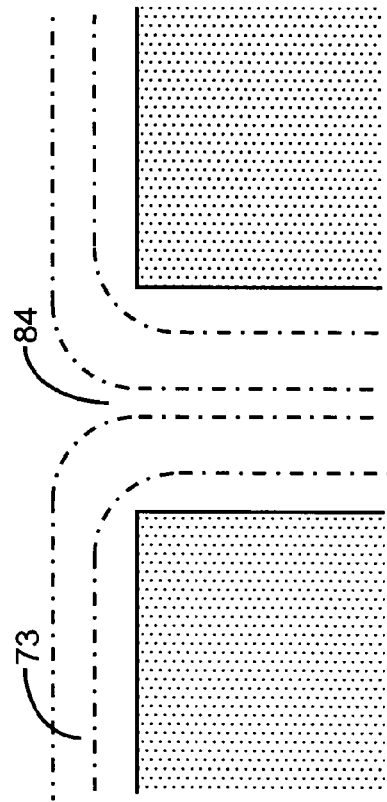
Figure 7E:
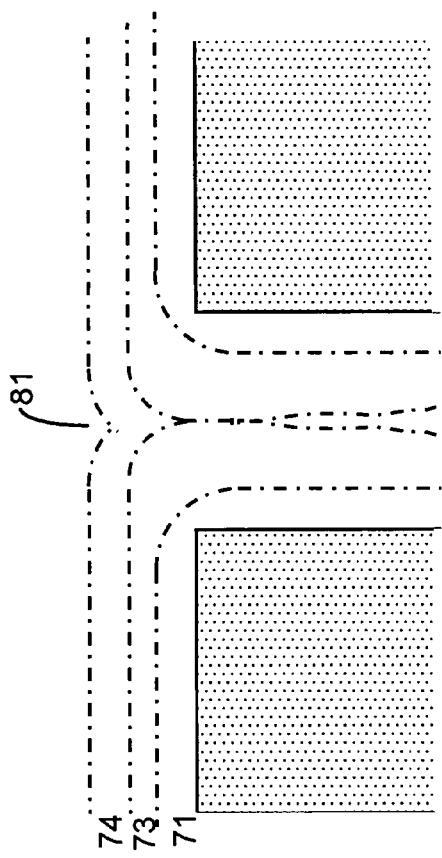
Figure 7F:
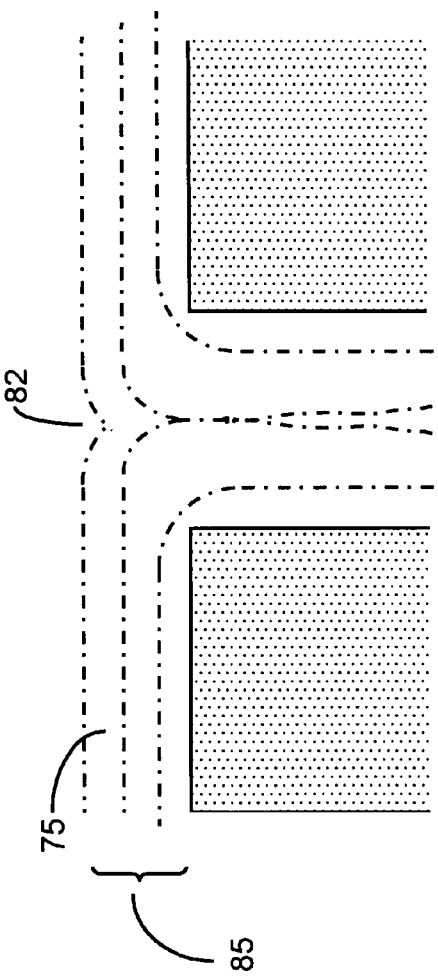

This problem is avoided by the use of multiple iterations of the deposit and anneal process described above. As shown in FIGS. 7A and 7B, a first, relatively thin (first) oxide layer 70 is formed over an underlying structure, including a trench structure. When annealed, oxide layer 70 shrinks to form a first annealed layer 71 having a reduced thickness as compared with layer 70. Second and third iterations of this process result respectively in second deposition layer 72, second annealed layer 73, third deposition layer 74 and third annealed layer 75. See, FIGS. 7C through 7E.

A fill gap 80 and/or crack 84 may form during the second (or other intervening) iteration. However, the third iteration effectively fills the gap or crack and results in a well formed, final oxide layer 85. Only three iterations are shown in the above example, but any reasonable number of deposition and anneal iterations may be used to form a final oxide layer effectively covering a trench or similar structure.

The degree to which a silicon oxide layer formed in accordance with the present invention is conformal is also well controlled. This high degree of control over deposition thickness and layer conformity, in addition to its crack-resistance and excellent etching characteristics make the silicon oxide layer formed according to the present invention ideal for use in some MEMS fabrications.

A silicon oxide layer formed according to the present invention is remarkably resilient to cracking. It may be formed with very low internal stress, if desired, and with well controlled stress in every mixture. The annealing step removes (or precludes the introduction of) contaminants and inclusions. Accordingly, the silicon oxide layer formed by the present invention may be readily etched, using HF-vapor for example, without producing etch residue. It also etches at a predictable, homogeneous rate, such that a wet etch, vapor etch, or plasma etch process applied to the silicon oxide layer will yield uniform etch fronts.

In a yet another aspect, the present invention provides a method for HF-vapor etching of a silicon oxide layer formed as described above. Effective HF-vapor etching without residue formation can not be effectively accomplished in an overly silicon-rich or carbon contaminated oxide layer. If excess silicon is present in the oxide, then the silicon oxide layer may be first etched down to a residue, left to sit in an ambient oxygen environment for some period of time, and thereafter etched again. Residue oxidation may be accelerated in an oxidizing environment. For example, an oxygen plasma may be applied to a substrate having an etch reside. Such alternatives to a clean oxide, while effective, are less preferred as being more time consuming. Yet, such less preferred alternatives still fall within the scope of the present invention.

Figure 8:
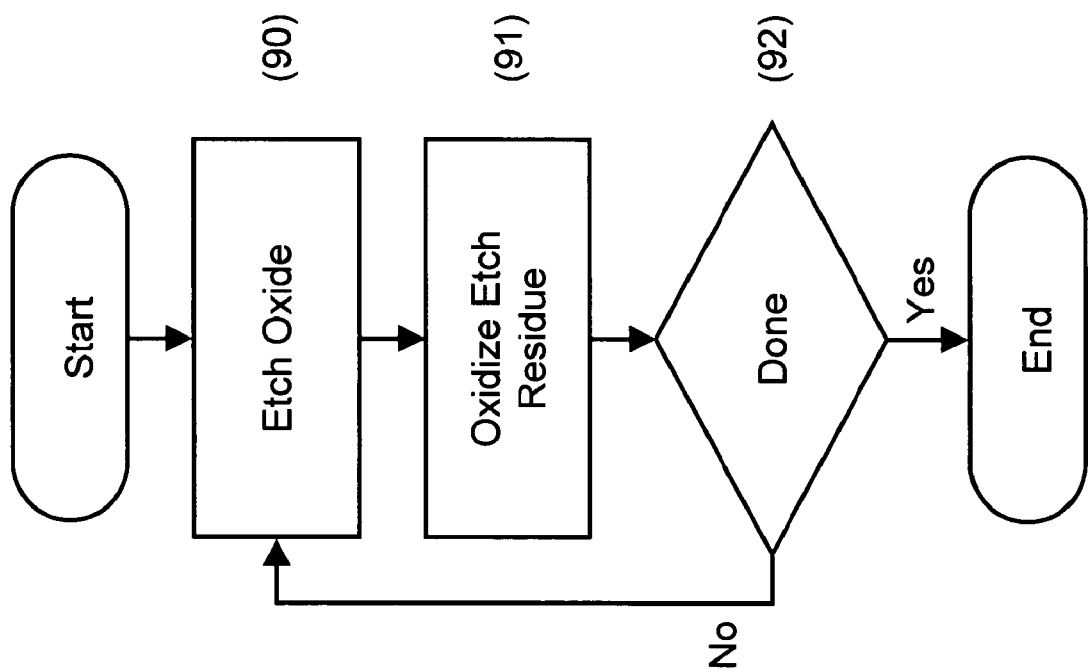

An exemplary method of HF vapor etching an oxide layer formed in accordance with the present invention is shown in FIG. 8. The method begins with the step of etching the oxide (90). Thereafter, any resulting etch residue is oxidized (91). Where an etch residue is apparent (92=No), it is further etched (return to 90) following oxidation. Once the oxide and any etch residue are removed (92=Yes), the method is complete.

The oxide formed in accordance with the present invention may doped or undoped. An entire oxide region or selected portions (or layers) of the oxide region can be doped. Where selected portions or layers of an oxide are doped, differential etch rates (or characteristics) may be obtained, as between the doped and undoped portions or layers. Such differential etch rates allow, for example, removal of the doped regions or layers while leaving the undoped regions and layers. Further, a doped oxide can be used to dope the MEMS structure.

A single dopant can be used. For example, by doping the oxide with boron, a borosilicate glass (BSG) is formed. Similarly, phosphorus may be used as an oxide dopant to form phosphosilicate glass (PSG). Multiple dopants can also be used within the context of the present invention. For instance, boron and phosphorus can be used as oxide co-dopants to form borophosphosilicate glass (BPSG).

The oxide can be doped with the inclusion of a dopant containing gas, such as diborane ($B_2H_6$) or phosphorus oxychloride ($POCl_3$). Alternatively, the dopants can be implanted using any one or more of a number of conventional techniques.

The addition of dopant(s) has the potential advantages of; decreasing the anneal temperature, decreasing the oxide stress, increasing the oxide deposition rate, increasing the oxide etch rate, gettering and trapping impurities, improving the oxide deposition conformality, and reflowing (thus smoothing and planarizing) the oxide during annealing.

A number of process variations and trade-offs have been noted above. The present invention is susceptible to numerous refinements and adaptations that will be apparent to those of ordinary skill in the art. In the context of the foregoing description and the attached claims, a "substrate" is broadly defined as any surface, with or without a MEMS structure, upon which an oxide might be formed. When an oxide is said to be formed "on" a substrate, this expression is not limited to the formation of the oxide directly on the substrate, but includes oxide formations on any surface previously formed on the substrate. The terms "forming" and "depositing (or deposition)" are used to broadly describe any process step or sequence of process steps allowing the production of an oxide. The terms "oxidizing" or "oxidation" broadly denote any decomposition of a gas or gases in the presence of oxygen.

MEMS fabrication processes are well recognized as being subject to varied implementations and modifications. The discussion above teaches several clear examples of how the present invention may be made using conventionally available deposition chambers. Only a few alternatives have been described above in the context of teaching examples. The present invention is not limited to these examples, but is defined by the attached claims.

What is claimed is:

1. A method of sealing a chamber of an electromechanical device having a mechanical structure overlying a substrate, wherein the mechanical structure is in the chamber, the method comprising:
    (a) iterating the following multiple times to form a sacrificial oxide layer:
        depositing a sub-layer of the sacrificial oxide layer over at least a portion of the mechanical structure by depositing a silicon oxide at a first temperature; and
        annealing the sub-layer of the sacrificial oxide layer at a second temperature higher than the first temperature;
    (b) depositing a first encapsulation layer over the sacrificial oxide layer;
    (c) forming at least one vent through the first encapsulation layer to allow removal of at least a portion of the sacrificial oxide layer;
    (d) removing at least a portion of the sacrificial oxide layer to form the chamber; and
    (e) depositing a second encapsulation layer over or in the vent to seal the chamber, wherein the second encapsulation layer is a semiconductor material;
    wherein each sub-layer of the sacrificial oxide layer is formed with a compressive stress.

2. The method of claim 1, wherein depositing the sacrificial oxide layer is performed in an oxygen-rich environment.

3. The method of claim 2, wherein annealing the sacrificial oxide layer is performed in an oxygen-rich environment.

4. The method of claim 1, wherein the semiconductor material is comprised of polycrystalline silicon, amorphous silicon, silicon carbide, silicon/germanium, germanium, or gallium arsenide.

5. The method of claim 4, wherein the first encapsulation layer is comprised of a polycrystalline silicon, amorphous silicon, germanium, silicon/germanium or gallium arsenide.

6. The method of claim 1, wherein a first portion of the first encapsulation layer is comprised of a monocrystalline silicon and a second portion is comprised of a polycrystalline silicon.

7. The method of claim 1, wherein removing at least a portion of the sacrificial oxide layer to form the chamber comprises: exposing the sacrificial oxide layer to an etching process through the vent.

8. The method of claim 7, wherein the etching processes comprises a HF-vapor etching process.

9. The method of claim 1, wherein the silicon precursor gas comprises at least one gas selected from a group of gases consisting of; tetaethoxysilane (TEOS), silane ($SiH_4$), dichlorosilane (DCS), diethlysilane (DES), and/or tetramethylcyclotetrasiloxane (TOMCATS).

10. The method of claim 1, wherein the compressive stress with which the sub-layers are formed is such that following the annealing of the sub-layers, the sacrificial oxide layer has a low enough tensile stress so as not to damage the mechanical structure.

11. The method of claim 1, wherein the formation of each of the sub-layers formed subsequent to a first one of the sub-layers, the first sub-layer having been formed prior to all of the other of the sub-layers, is directly on a respective previously formed one of the sub-layers.

12. The method of claim 1, wherein:
    the substrate is subjected to subsequent processing steps after the silicon oxide layer is formed; and
    the second temperature is approximate to a highest processing temperature applied to the substrate during the subsequent processing steps.

13. The method of claim 12, wherein the compressive stress with which the sub-layers are formed is such that following the application of the highest processing temperature to the substrate, the silicon oxide layer has a low enough internal stress so as not to damage the mechanical structure.

14. A method of sealing a chamber of an electromechanical device having a mechanical structure overlying a substrate, wherein the mechanical structure is in the chamber, the method comprising:
    (a) iterating the following multiple times to form a sacrificial oxide layer:
        depositing a sub-layer of a sacrificial oxide layer over at least a portion of the mechanical structure; and
        annealing the sub-layer of the sacrificial oxide layer;
    (b) depositing a first encapsulation layer over the sacrificial oxide layer;
    (c) forming at least one vent through the first encapsulation layer to allow removal of at least a portion of the sacrificial oxide layer;
    (d) removing at least a portion of the sacrificial oxide layer to form the chamber; and
    (e) depositing a second encapsulation layer over or in the vent to seal the chamber, wherein the second encapsulation layer is a semiconductor material;
    wherein each sub-layer of the sacrificial oxide layer is formed with a compressive stress.

* * * * *